United States Patent [19]

Moriguchi et al.

[11] Patent Number: 5,776,588
[45] Date of Patent: Jul. 7, 1998

[54] COATED HARD ALLOY TOOL

[75] Inventors: Hideki Moriguchi; Daisuke Murakami; Akihiko Ikegaya; Toshio Nomura, all of Itama, Japan

[73] Assignee: Sumitomo Electric Industries, Ltd., Osaka, Japan

[21] Appl. No.: 690,911

[22] Filed: Aug. 1, 1996

Related U.S. Application Data

[62] Division of Ser. No. 427,601, Apr. 24, 1995, Pat. No. 5,597,272.

[30] Foreign Application Priority Data

Apr. 27, 1994 [JP] Japan ................... 6-89758

[51] Int. Cl.⁶ ........................... B23B 27/14
[52] U.S. Cl. ................ 428/210; 428/195; 428/141; 428/148; 428/698; 428/701; 407/119
[58] Field of Search ............ 407/119; 428/216, 428/336, 698, 701, 702, 195, 210, 141, 148

[56] References Cited

U.S. PATENT DOCUMENTS

| | | | |
|---|---|---|---|
| 4,643,620 | 2/1987 | Fujii et al. | 407/119 |
| 4,720,437 | 1/1988 | Chudo et al. | 428/698 |
| 4,755,399 | 7/1988 | Fujii et al. | 427/277 |
| 4,966,501 | 10/1990 | Nomura et al. | 407/119 |
| 4,984,940 | 1/1991 | Bryant et al. | 407/119 |
| 5,250,367 | 10/1993 | Santhanam et al. | 407/119 X |
| 5,431,072 | 7/1995 | Christoffel | 407/119 X |
| 5,597,272 | 1/1997 | Moriguchi et al. | 407/119 |

FOREIGN PATENT DOCUMENTS 5111810  5/1993  Japan ................... 408/145

*Primary Examiner*—Archene Turner
*Attorney, Agent, or Firm*—Wenderoth, Lind & Ponack

[57] ABSTRACT

An improved coated hard alloy tool having a substrate made of a hard alloy, and a multi-layer ceramic coating film provided on the surface of the substrate, the coating film including at least one oxide layer. The top several layers of the coating film are missing partially or completely in an area where the tool is brought into frictional contact with a workpiece. At least one oxide layer (such as $Al_2O_3$ layer) is included in the missing layers. This increases wear resistance of the coated hard alloy tool.

6 Claims, 3 Drawing Sheets

COATED HARD ALLOY TOOL

This is a divisional application of Ser. No. 08/427,601 filed Apr. 24, 1995 now U.S. Pat. No. 5,597,272.

BACKGROUND OF THE INVENTION

The present invention relates to a coated hard alloy tool used as a cutting tool that is required to show high wear resistance or other wear-resistant tool, and more particularly to a tool formed from a hard alloy and coated with a multilayered ceramic film which has good resistance to peeling and chipping.

Conventional steel cutting tools were made of cemented carbide (WC-Co alloy with carbonitrides of Ti, Ta or Nb added). However, in order to cope with increasing cutting speeds, most of such tools are nowadays formed from a matrix of a cemented carbide, a cermet or a ceramic material such as alumina or silicon nitride having its surface coated by CVD or PVD process with a 3–10 micron thick film of a carbide, nitride, carbonitride, carbooxide, boron nitride or oxide of a metal belonging to the IVa, Va or VIa group in the periodic table or Al, or their solid solution.

First-generation such coated tools had mainly a coating of a titanium compound of high hardness so that they showed high wear resistance at their rake face. But as the cutting speed of the tools increases, in order to reduce crator-like wear formed in the rake face, such a coating was gradually replaced by a triple-layer coating consisting of a lowermost titanium compound layer, an intermediate oxidation-resistant $Al_2O_3$ layer, and a top gold TiN layer which is used to distinguish used corners from not-used ones. Most of the present-day tools have a coating of this type. In particular, it is now considered essential that such a coating include an oxide layer such as $Al_2O_3$.

By increasing the thickness of the coating or by providing an $Al_2O_3$ layer in the coating, the wear resistance of the tools improved. But their resistance to chipping decreased. This is presumably because the coating itself is a brittle material and thus it is likely to suffer cracks that extend the entire thickness of the coating. Another reason is that by providing a layer of $Al_2O_3$ in the coating, the surface roughness of the coating increases. Thus, in order to improve the resistance to chipping. Unexamined Japanese Patent Publication 55-150941 and Examined Japanese Patent Publication 5-9201 proposed to reduce the thickness of the coating only at the ridge of the cutting edge. For the same purpose, Unexamined Japanese Patent Publications 62-228305 and 5-57507 proposed to limit the surface roughness of the $Al_2O_3$ layer below a predetermined value.

The solutions proposed in these publications were effective to some degree in improving the resistance to chipping, but could not improve the wear resistance of the tool and particularly the peel resistance of the film coating. The tool can be damaged easily once their coating layer peels. Thus, the life of such a tool was short. A tool made of a hard alloy and having a coating which is less likely to peel has been long awaited.

It is an object of the present invention to provide a coated hard alloy tool that exhibits high resistance to chipping, wear and peeling in a balanced manner, and thus reveals high performance in cutting metals, and that shows long life.

SUMMARY OF THE INVENTION

In order to achieve this object, we, the present inventors, studied the mechanism in cutting materials. As a result, we found that it is possible to dramatically improve the peel resistance and the resistance to chipping in a balanced manner if such a tool comprises a substrate made of a hard alloy, and a multi-layer ceramic coating film provided on the surface of the substrate, the coating film including at least one oxide layer, the top several layers of the coating film being missing partially or completely in an area where the tool is brought into frictional contact with a workpiece, at least one oxide layer being included in the missing layers, whereby a non-oxide layer is exposed at the area where the top several layers are missing.

It is most desirable to completely remove the oxide layer or layers in the frictional contact area such as the area along the ridge of the cutting edge. But the effect of the invention is expectable even if such oxide layers are removed only partially, or even if at least one of a plurality of oxide layers is partially or completely removed along the entire ridge of the cutting edge.

The term "ridge of the cutting edge" herein used refers to a portion of the cutting edge which was subjected to strengthening treatment, e.g. the portion designated by the letter A in FIGS. 1B and 1C. In both figures, numeral 1 designates the rake face and 2 does the flank. The ridge of the cutting edge shown in FIG. 1B is strengthened by round honing. In FIG. 1C, it is strengthened by chamfering. Instead of flat chamfering as shown in FIG. 1C, the ridge may be strengthened by providing a moderately curved chamfer.

To achieve the effect of the present invention, the length of the portion of the cutting edge where the oxide coating layer is removed has to be not less than 10% of the effective cutting length of the cutting edge. If this percentage is 50% or higher, better results will be achievable. Best results can be expected if it is 100%. This percentage is measured in the following manner: The nose portion of the tool is photographed from a suitable direction with a scanning electron microscope (SEM) so that the existence of the oxide layer can be checked; a line is drawn on the photo thus taken so as to run in the ridge of the cutting edge in parallel to the cutting edge; the length of the oxide layer-free portions along the line is measured; and the ratio of this length to the length of the entire portion of the cutting edge actually used in cutting operation and including the arcuate nose portion 3 (FIG. 1A) is given in percentage.

FIGS. 4A–4E show in detail how this percentage is measured. The tool used has a three-layer coating consisting of innermost TiCN layer/intermediate $Al_2O_3$ layer/outermost TiN layer. The portion of the cutting edge designated by $\alpha$ in FIG. 4A is the portion actually used in cutting. FIGS. 4B and 4C show SEM-created images that cover the portion $\alpha$ of the cutting edge after partially removing the upper coating layers. FIGS. 4D and 4E are sections taken along line X-Y of FIGS. 4A and 4B, respectively. In these composition images, the TiN, $Al_2O_3$ and TiCN layers look in different color tones. Parallel lines C are drawn on the images of FIGS. 4B and 4C in parallel to the cutting edge. The rate of the portion along these lines where $Al_2O_3$ or TiCN is exposed is measured. In FIG. 4B, $Al_2O_3$ layer is completely missing along the line C. In other words, the rate of $Al_2O_3$-free portion is 100%. In FIG. 4C, there are a plurality of portions along the line C where $Al_2O_3$ and TiCN are exposed. In this case, the removal rate of the oxide layer is given by (a1+a2+. . . a8)/effective cutting length of the cutting edge, where a1–a8 are the lengths of the portions along the line C where the innermost TiCN layer is exposed.

If the coating contains a plurality of oxide layers, all of them do not have to be removed. But any $Al_2O_3$ layer or layer mainly composed of $Al_2O_3$ should be removed completely from the ridge of the cutting edge, because $Al_2O_3$ is especially low in resistance to seizure. By the layer mainly composed of $Al_2O_3$, we mean composite layers of $Al_2O_3$ and $ZrO_2$, $Al_2O_3$ and AlN, or $Al_2O_3$ and TiC in which $Al_2O_3$ is a major component.

The underlying film layer which is exposed by removing the top several layers in the coating should be one mainly composed of nitrides or carbonitrides, preferably a TiCN film having a C to N mole ratio of 5:5 to 7:3. More preferably, the underlying film which has been exposed by removing the top layers should have a residual stress of −5 to 10 kgf/mm$^2$. Also, such an exposed inner layer should preferably have an average surface roughness Ra of 0.05 μm or less.

When cutting a metal, especially a steel, the maximum temperature at the rake face can reach as high as 1000° C. or more. It is therefore necessary to coat such a tool with an oxide which is highly resistant to oxidation. Thus, commercially available tools are coated with an oxide film, typically an $Al_2O_3$ film. We conducted detailed observation of these tools to check how they are damaged. As a result, we discovered that many of them were discarded in spite of the fact that wear was very slight. We further observed the cutting edges of such discarded inserts under a scanning electron microscope. In this observation, many minute chippings were found along the ridge of the cutting edge. At these chipped portions, the matrix of a cemented carbide was exposed. If such inserts were still kept in use for cutting, welding might occur at the portions where the matrix is exposed, or wear or chipping might progress rapidly. Thus, such inserts could cause serious trouble in production line. This will be the reason why these inserts are discarded as useless even though they are worn little.

We therefore thought that if such minute chippings were reduced, it could be possible to extend the life of such inserts. We thus examined the coating film in an attempt to find out in what mechanism it is damaged. As a result, we found out that the temperature at the ridge of the cutting edge during cutting is lower than the temperature at the rake face, so that adhesive wear tends to occur, and frictional stress produced at the rake face becomes maximum at the ridge of the cutting edge; chips thus adhere first to the ridge of the cutting edge; and the coating film is peeled off by the frictional stress, so that minute chippings occur in the coating film. Thus, we thought that if the coating film has such a structure or is formed from such a material that chips are less likely to adhere to the ridge of the cutting edge, it could be possible to reduce minute chippings or peelings of the coating film observed on conventional discarded inserts.

Then, the present inventors have tried to find the best way to reduce adhesive wear of the coating film and found the solution as disclosed in the present application. Namely, the occurrence of adhesion is related to physical surface irregularities as represented by surface roughness. In Unexamined Japanese Patent Publications 62-228305 and 5-57507, trials were made to improve the surface roughness of the $Al_2O_3$ layer by post-treatment to prevent the peeling, decrease in strength and adhesion of the coating film.

But adhesion and welding are related not only to the surface roughness but to chemical phenomena such as seizure. Thus, we compared the resistance to seizure of oxide ceramics with those of nitrides and carbides. The results for the oxides were the worst of all. Heretofore, trials were made to reduce the friction coefficient by improving the surface roughness of oxides such as $Al_2O_3$. But because the resistance to seizure of such oxides is low, their peel resistance is still very low. We therefore tried to partially or completely remove oxide layers such as $Al_2O_3$ from the ridge of the cutting edge, where the frictional stress becomes maximum. We confirmed that with this arrangement, the coating layer was least likely to seize to the workpiece and its peel resistance improved dramatically to such an extent that no chippings were observed and that it was possible to dramatically extend the life of the tool.

Since nitrides and carbides are less likely to seize to metals, the peel resistance is improved if such a layer is exposed at the ridge of the cutting edge. Preferably, such a layer should be formed from a TiCN film so that the mol fraction C:N will be between 5:5 and 7:3, because such a film has not only excellent resistance to seizure but it also shows exceptionally high wear resistance. Thus, the tool having such a layer exposed will show a markedly long service life. A TiCN film having such a composition can be formed by an ordinary HT (HIGH TEMPERATURE)-CVD. But to control the C-to-N ratio more stably, such a film should be formed by a CVD method that uses an organic CN compound as a reaction gas.

The mole ratio of C to N can be calculated by measuring the lattice constant of the TiCN film by ESCA (ELECTRON SPECTROSCOPY FOR CHEMICAL ANALYSIS), EPMA (ELECTRON PROBE-MICRO ANALYZER), or by X-ray analysis. The results of X-ray analysis conducted by us revealed that where the mole ratio of C to N was within the range between 5:5 and 7:3, the lattice constant of the TiCN film was 4.275 to 4.295 Å. Within this range, the resistances to seizure and wear were excellent. Considering the stoichiometry of TiCN, this result may sound a little contradictory. This contradiction presumably results from the fact that the TiCN film has such a nonstoichiometric composition as represented by Ti(CN)0.9, instead of strictly stoichiometric composition.

By adjusting the residual stress in the film exposed by removing the upper layers to −5 to 10 kgf/mm$^2$, we found that the peel resistance improved still further. If the residual stress is less than −5 kgf/mm$^2$, the film may be destroyed under compressive force. If more than 10 kgf/mm$^2$, the peel resistance will improve little. Thus, such residual stress should be within the range of −5 to 10 kgf/mm$^2$.

We also found the fact that if the average of the surface roughness Ra of the film exposed at the portion where the top layers are removed is 0.05 μm or less, part of the oxide layer remains along the ridge of the cutting edge, so that the peel resistance of the film improves still further even if Rmax is large. If larger than 0.05 μm, the peel resistance will not improve sufficiently.

The flank face of the insert is not heated to so high a temperature during cutting as at the rake face. Thus, an oxide film on the flank would serve little to improve the wear resistance. Rather, such an oxide film tends to abrade the flank face by peeling off in lumps, thus lowering the wear resistance. For higher wear resistance, the top layer-free portion on the flank should be wider than that on the rake face. On the other hand, if it is desired to improve the resistance to chipping, the top layer-free portion on the flank should be wider than that on the rake face, or otherwise the top layer-free portion at the arcuate nose portion should be wider than that on the straight portion of the cutting edge. Thus, the widths of the top layer-free portions should be determined depending upon which of the abovementioned properties of the tool is of the most importance.

In the present invention, after forming a coating layer on a hard alloy by CVD or PVD, the thickness of the coating is reduced along the ridge of the cutting edge by barrel polishing, shot blasting, shot peening, by finishing with an elastic grindstone, a resin brush having abrasive grains, or a roller, by burnishing, chemical treating, ultrasonic vibration, or laser treating.

Whether or not there exists an oxide layer on the ridge of the cutting edge can be confirmed by WDS (WAVELENGTH DISPERSIVE SPECTROSCOPY) using an A-SEM (ANALYTICAL SCANNING MICROSCOPE), by EDS (ENERGY DISPERSIVE SPECTROSCOPY) analysis, or by observing a given section under an optical microscope, an SEM or an EPMA after polish-lapping and etching.

The residual stress in the film can be measured by the sin2φ method using X-rays. If there remains an oxide film layer as in FIG. 4C, it is difficult to measure the average of surface roughness values Ra of the film with a contact-type surface roughness meter. Thus, we measured it under an SEM for rough surface observation using electron beams. The average of the surface roughness values Ra refers to the values Ra measured along 180 lines that extend in the horizontal direction in a visual field.

In the state shown in FIG. 4C, the roughness of the surface including the surface of $Al_2O_3$ is extremely high. Namely, the Rmax of surface roughness values exceeds the thickness of the removed oxide layer. In the present invention, the surface roughness of the coating layer not including such an oxide layer is set below a predetermined level. We have found that with this arrangement, it is possible to maximize the peel resistance of the coating.

The coated hard alloy according to the present invention is less likely to weld and thus to suffer peeling of its coating film or chipping of its cutting edge. Its life is therefore long and the workpieces cut by such a tool will present a smoother surface.

Other features and objects of the present invention will become apparent from the following description made with reference to the accompanying drawings, in which:

DETAILED DESCRIPTION OF THE PREFERRED EMBODIMENT

Now description is made of Examples of the present invention.

Experiment 1

We prepared sample Nos. 1–11 of coated hard alloy tool (insert) (Table 3). They were formed by combining different kinds of hard alloys a–f shown in Table 1 and having the shape of type CNMG433 with different kinds of hard films or coatings A–H shown in Table 2 formed by HT (HIGH TEMPERATURE)-CVD. The coating of layer of Sample No. 1 was removed along the ridge of the cutting edge by use of a vibratory barreling machine. By changing the treating time, we prepared Control Article 1 and Articles 1–6 of the invention which have different removal rates of oxide layers along the ridge of the cutting edge as shown in Table 4.

Figure 1A:
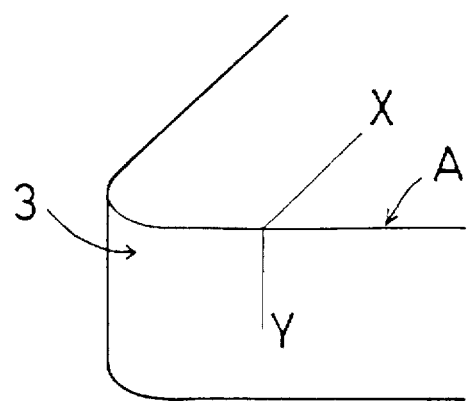
FIG. 1A is a partial perspective view of a cutting tool (insert).
Figure 1B:
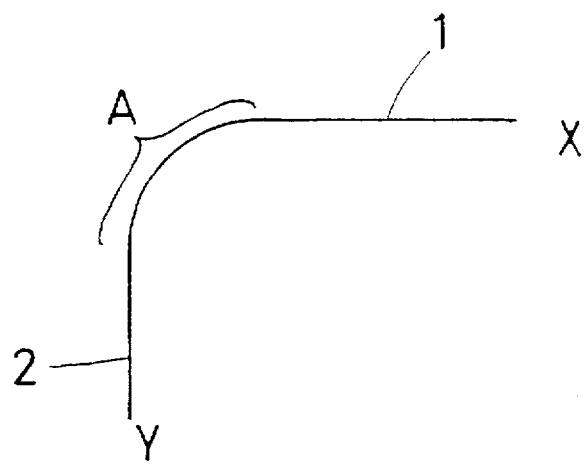
FIG. 1B is an enlarged sectional view taken along line X-Y of FIG. 1A.
Figure 1C:
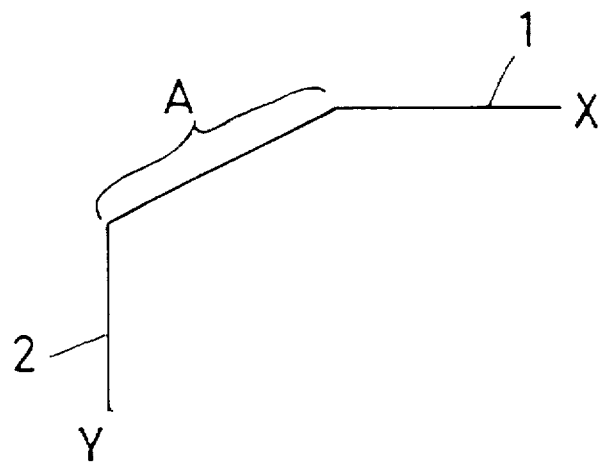
FIG. 1C is a view similar to FIG. 1B but showing a different cutting edge.
Figure 2:
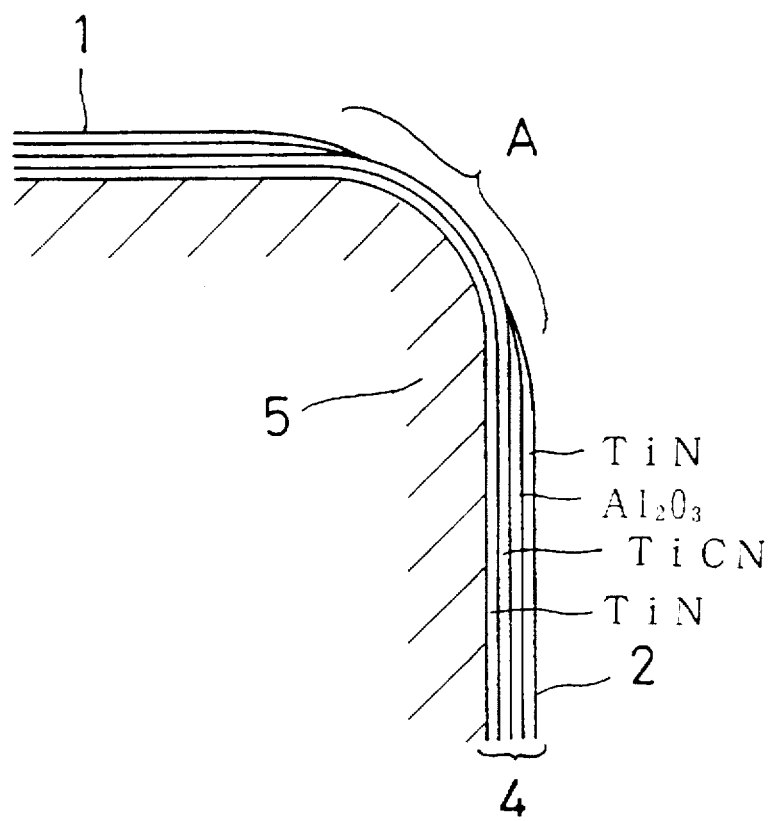
FIG. 2 is an enlarged sectional view of a cutting edge of an insert embodying the present invention.

The results of observation under an A-SEM confirmed that TiCN was exposed at the portion where $Al_2O_3$ has been removed. FIG. 1 shows a section of the cutting edge of a tool according to the invention, in which numeral 5 designates the substrate, and 4 does a multi-layer ceramic coating film.

Figure 3:
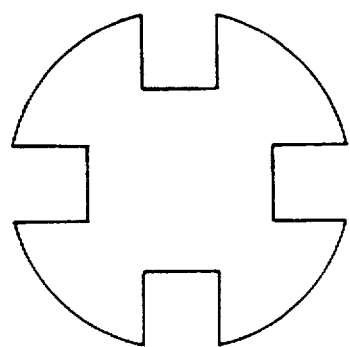
FIG. 3 is a sectional view of a workpiece used in a cutting test.
Figure 4A:
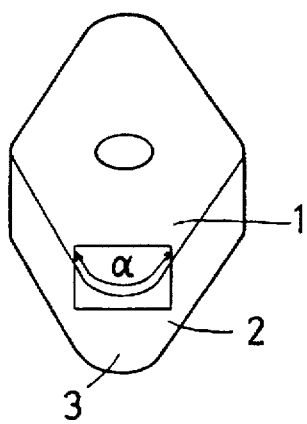
FIGS. 4A to 4E are views showing how the removal rate of oxide layers is measured.
Figure 4B:
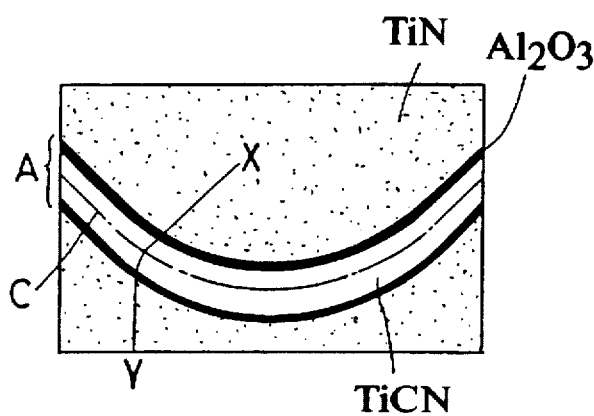
Figure 4C:
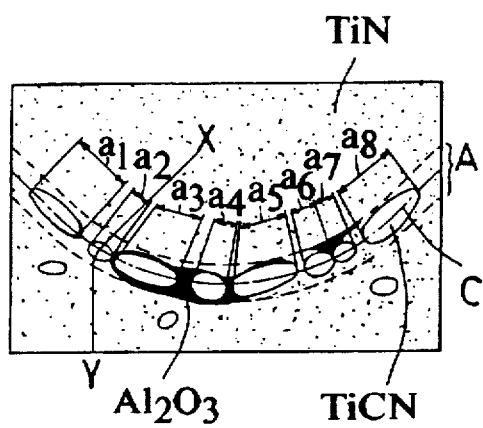
Figure 4D:
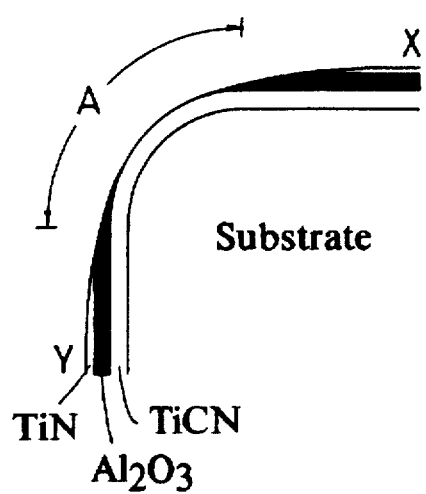
Figure 4E:
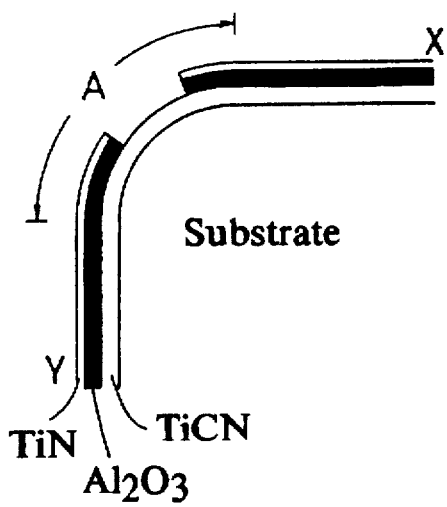

The removal rate of oxide layers along the ridge of the cutting edge was measured by observing under an A-SEM. The tools of Control Article 1 and Articles 1–6 of the invention were used to cut a workpiece made of SCM415 and having the shape as shown in FIG. 3 (a round rod having four grooves in the outer periphery so that cutting will be discontinuous). We compared them for service lives.

Cutting conditions

Cutting speed: 200 m/min
Feed: 0.3 mm/rev
Depth of cut: 1.5 mm
Type of cutting: Wet type
Holder used: PCLNR2525-43

We observed a reflected electronic image of each tool picked up by an SEM and determined that its life had expired when its substrate was exposed.

In this test, as shown in FIG. 4, Articles 1–6 of the invention all exhibited higher peel resistance than Control Article 1, in which the oxide layer was not removed at all. Article 4–6, in which oxide layers were removed by more than 50%, showed particularly good results. Most notably, Article 6, in which oxide layers were removed 100% along the ridge of the cutting edge, showed six times as high a peel resistance as that of Control Article 1.

Experiment 2

We prepared Articles 6 and 7 of the invention by removing oxide layers by 100% from tool samples Nos. 1 and 6 along the ridge of the cutting edge with a diamond brush so that they will have the same structure and thickness of coating at the ridge of the cutting edge and the same processing amount at the tip of the cutting edge. They were subjected to the same cutting test as in Experiment 1. As is apparent from the test results shown in Table 5, both Articles showed similar performance in the peel resistance. As for Control Articles 1 and 2 which correspond to Articles 6 and 7 but have coatings not removed at all, the former was inferior to the latter in peel resistance. When comparing Article 6, in which $Al_2O_3$ was removed, with Article 7, in which $ZrO_2$ was removed, the former showed higher improvement in peel resistance than the latter. This shows that in order to improve the peel resistance, $Al_2O_3$ should be removed rather than $ZrO_2$.

Experiment 3

We prepared Articles 8 and 9 according to the invention by removing $Al_2O_3$ and both $Al_2O_3$ and $ZrO_2$, respectively, from sample No. 5 along the ridge of the cutting edge by shot blasting using glass beads. They were subjected to the same cutting test as in Experiment 1. As is apparent from the test results shown in Table 6, Article 9, in which all the oxide layers were removed along the ridge of the cutting edge, showed higher performance than Article 8, in which only $Al_2O_3$ was removed with $ZrO_2$ remaining along the ridge of the cutting edge.

When comparing Article 6 with Article 9, the former, in which only a layer composed mainly of nitrides or carbonitrides remained along the ridge of the cutting edge, was superior in peel resistance to the latter, in which only a layer mainly composed of carbides remained along the ridge of the cutting edge.

Experiment 4

We prepared Articles 10–14 according to the invention by pressing an elastic grindstone against Sample Nos. 2–4, 7 and 8, respectively, from above their rake face to remove all the oxide layers along the ridges of their cutting edges. The inserts thus obtained were used to cut a mold made of SKD62 under the following conditions:

Cutting conditions
  Cutting speed: 100 m/min
  Feed rate: 0.2 mm/rev
  Depth of cut: 2 mm
  Type of cutting and the holder used: the same as in Experiment 1.

The time taken until the substrate was exposed was used as the service life of each insert.

The test results are shown in Table 7. In spite of the fact that in Articles 10 and 11 according to the invention, oxide layers were missing along the ridges of their cutting edges, Article 11 showed higher peel resistance. This is presumably because Article 11 kept only a carbonitride layer along the ridge of the cutting edge, while Article 10 retained all of the carbide, nitride and carbonitride layers. From Table 7, it is also apparent that Article according to the invention having a substrate made of ISO K20 cemented carbide or cermet and having its oxide layers removed was higher in peel resistance than Control Articles having a substrate also made of the same substrate but having its oxide layers not removed at all.

Experiment 5

We prepared Articles 15–17 according to the invention by removing all the oxide layers along the ridges of the cutting edges of Sample Nos. 9–11, respectively, by use of a centrifugal barrel. The inserts prepared were used to cut ductile cast iron FCD30 under the following conditions:

Cutting conditions
  Cutting speed: 300 m/min
  Feed rate: 0.4 mm/rev
  Depth of cut: 2 mm
  Type of cutting: Dry type
  The holder used and the way of determining the service life were the same as in other experiments.

The test results are shown in Table 8. From this table, it is apparent that Articles according to the invention whose substrates were made of different kinds of ceramics all showed higher peel resistance than Control Articles having the same substrates but having their oxide layers not removed at all.

Experiment 6

We prepared Sample No. 12 having the same substrate and the same coating structure as Sample No. 1 except that the TiCN layer was formed by CVD using an organic CN compound as a reaction gas. We compared the C:N mol fraction in the TiCN layers on Sample Nos. 1 and 12 by ESCA. In Sample No. 1, the C:N ratio was 8:2, while that of Sample No. 12 was 6:4. We prepared Articles 18–20 from Sample No. 12 by removing $Al_2O_3$ along the ridges of the cutting edges at different rates in the same manner as in Experiment 1. They were subjected to the same cutting test as in Experiment 1. After removing $Al_2O_3$, we observed the ridge of the cutting edge of each article under an A-SEM. It was confirmed that TiC-N was exposed locally or completely along the ridge of the cutting edge. The results of the test and the SEM observation are shown in Table 9. We compared Articles 1–6 and 18–20 according to the invention and Control Article 4, which was nothing but Sample No. 12 with its oxide layers not removed at all. The inserts having a TiCN layer whose mole ratio of C:N is between 5:5 and 7:3 and which is exposed partially or completely along the ridge of the cutting edge were especially high in peel resistance.

Experiment 7

Sample No. 1 (Control Article 1) and Articles 1–6 according to the invention were used to cut a round rod made of SCM435 and having four grooves as shown in FIG. 3 under the following conditions:

Cutting conditions
  Cutting speed: 100 m/min
  Feed rate: 0.4 mm/rev
  Depth of cut: 2 mm
  Type of cutting: Dry type
  The holder used was the same as in other experiments.

The life of each of the four corners of each insert was judged to have expired when it chipped. The average lifetime of the four corners was used as the life of the entire insert.

The test results are shown in Table 10. From this table, it is apparent that Articles according to the invention are all higher in the resistance to chipping than Comparative Article.

Experiment 8

We prepared Article 21 according to the invention by removing $Al_2O_3$ layer along the ridge of the cutting edge of Sample No. 13 using a vibratory barreling machine. It was subjected to the same cutting test as in Experiment 1. The test results are shown in Table 11. As is apparent from this table, Article 21 was higher in peel resistance than Control Article 5, even though only its outer $Al_2O_3$ layer was removed.

Experiment 9

We prepared Articles 22–25 according to the invention by removing oxides by 100% along the ridge of the cutting edge of Sample No. 2 by blasting (Article 22), by centrifugal barreling (Article 23), by vibratory barreling (Article 24), and by rotary barreling (Article 25). The residual stress in the coating film along the ridge of the cutting edge of each insert was measured by the $sin2\phi$ method using X-rays (Cr-K$\alpha$) on the TiC (422) surface. The results of measurements are shown in Table 12. These specimens were subjected to the same cutting test as in Experiment 1. The test results are also shown in Table 12. Articles 23 and 24, which showed residual stresses within the range of −5 to 10 kgf/mm$^2$, showed higher performance than Articles 22 and 25, whose residual stresses were outside the above range.

Experiment 10

We prepared Article 26 according to the invention by removing $Al_2O_3$ by 50% along the ridge of the cutting edge of Sample No. 1 prepared in Experiment 1 by blasting with iron balls having a diameter of about 200 μm. We also prepared from Sample No. 1 Articles 27–29 according to the invention by polishing with a burnishing compound using a rotary barrel for different periods of time. We measured the average surface roughness Ra of the TiCN layer exposed along the ridge of the cutting edge with a surface roughness meter ERA4000 made by ELIONIX INC. at the 5000× magnification, the size of the visual field being 18×24 μm. The results of measurements are shown in Table 13. These specimens were subjected to the same cutting test as in Experiment 1. The test results are also shown in Table 13. Articles 27, 28 according to the invention, which had an average surface roughness Ra not exceeding 0.05 μm, showed higher performance than Article 26, which had an average surface roughness Ra of more than 0.05 μm.

The present invention is not limited to the examples described above.

For example, the concept of the invention is equally applicable to milling cutters, rotary cutting tools such as drills and end mills, and other hard wearing tools used for non-cutting purposes such as punches, dies and slitters. Namely, it is because punches and slitters have edges similar to the ridge of the cutting edge of cutting tool, while dies, though having no such edges, have a surface adapted to be brought into frictional contact with a workpiece. Thus, by removing oxide layers which are low in weld resistance from such edges and frictional surfaces, it would be possible to improve various properties of these tools.

TABLE 1

| No. | Substrate |
|---|---|
| a | ISO M20 cemented carbide |
| b | ISO M20 cemented carbide |
| c | commercially available cermet tool |
| d | commercially available silicon nitride tool |
| e | commercially available whisker reinforced ceramic tool |
| f | commercially available $Al_2O_3$ tool |

TABLE 2

| No. | Film layer |
|---|---|
| A | Substrate/0.5 μm TiN/5 μm TiCN/2 μm $Al_2O_3$/0.5 μm TiN |
| B | Substrate/2 μm TiC/1 μm TiCN/3 μm TiN/1 μm TiC/1 μm TiCO/2 μm $Al_2O_3$ |
| C | Substrate/7 μm TiCN/1 μm $HfO_2$/2 μm $Al_2O_3$ |
| D | Substrate/3 μm TiN/1 μm $Al_2O_3$/0.5 μm TiN |
| E | Substrate/15 μm TiC/10 μm $Al_2O_3$ |
| F | Substrate/5.5 μm TiC/1 μm $ZrO_2$/0.5 μm TiBN/1 μm $Al_2O_3$ |
| G | Substrate/0.5 μm TiN/5 μm TiCN/2 μm $ZrO_2$/0.5 μm TiN |
| H | Substrate/1 μm TiN/2 μm TiCN/15 μm $Al_2O_3$/15 μm TiCN/2 μm $Al_2O_3$/0.5 μm TiN |

TABLE 3

| | Sample No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Substrate | a | a | a | a | a | a | b | c | d | e | f | a | a |
| Film | A | B | C | E | F | G | B | D | D | D | D | A | H |

TABLE 4

| | Sample No. before processing | Removal ratio* (%) | Cutting time** (second) |
|---|---|---|---|
| Control article 1 | 1 | 0 | 40 |
| Article 1 | 1 | 10 | 50 |
| Article 2 | 1 | 23 | 80 |
| Article 3 | 1 | 39 | 100 |
| Article 4 | 1 | 54 | 150 |
| Article 5 | 1 | 76 | 180 |
| Article 6 | 1 | 100 | 240 |

*Percentage in which the oxide was removed.
**Cutting time is the time elapsed for cutting before the substrate is exposed.

TABLE 5

| | Sample No. before processing | Removal ratio (%) | Cutting time (second) |
|---|---|---|---|
| Control article 1 | 1 | 0 | 40 |
| Article 6 | 1 | 100 | 240 |
| Control article 2 | 6 | 0 | 70 |
| Article 7 | 6 | 100 | 240 |

TABLE 6

| | Sample No. before processing | Cutting time (second) | How much the oxide was removed* |
|---|---|---|---|
| Control article 3 | 5 | 30 | Not processed |
| Article 8 | 5 | 100 | $Al_2O_3$ was removed 100% |
| Article 9 | 5 | 170 | Both $Al_2O_3$ and $ZrO_2$ were removed 100% |

*How much the oxide was removed along the ridge of the cutting edge.

TABLE 7

| | Sample No. before processing | Cutting time (second) | Ratio in performance to unprocessed articles |
|---|---|---|---|
| Article 10 | 2 | 300 | 4.5 times |
| Article 11 | 3 | 420 | 7 times |
| Article 12 | 4 | 180 | 9 times |
| Article 13 | 7 | 240 | 4 times |
| Article 14 | 8 | 180 | 3 times |

TABLE 8

| | Sample No. before processing | Cutting time (second) | Ratio in performance to unprocessed articles |
|---|---|---|---|
| Article 15 | 9 | 320 | 6.4 times |
| Article 16 | 10 | 240 | 6 times |
| Article 17 | 11 | 220 | 5.5 times |

TABLE 9

| | Sample No. before processing | Removal ratio (%) | Cutting time (second) |
|---|---|---|---|
| Control article 1 | 1 | 0 | 40 |
| Article 6 | 1 | 100 | 240 |
| Control article 4 | 12 | 0 | 40 |
| Article 18 | 12 | 31 | 130 |
| Article 19 | 12 | 75 | 230 |
| Article 20 | 12 | 100 | 340 |

TABLE 10

| | Sample No. before processing | Cutting time (second) |
|---|---|---|
| Control Article 1 | 1 | 2 |
| Article 1 | 1 | 13 |
| Article 2 | 1 | 24 |
| Article 3 | 1 | 31 |
| Article 4 | 1 | 67 |
| Article 5 | 1 | 82 |
| Article 6 | 1 | 93 |

TABLE 11

| Sample No. before processing | Removal ratio (%) | Cutting time (second) |
|---|---|---|
| Control article 5 | 13 | 0 | 29 |
| Article 21 | 13 | 100 | 328 |

Control Article 5 is an unprocessed article of sample No. 13.

TABLE 12

| Sample No. before processing | Residual stress (kgf/mm$^2$) | Cutting time (second) |
|---|---|---|
| Control article 6 | 2 | 30 | 30 |
| Article 22 | 2 | −7 | 140 |
| Article 23 | 2 | 0 | 270 |
| Article 24 | 2 | 8 | 230 |
| Article 25 | 2 | 15 | 170 |

Control Article 6 is an unprocessed article of sample No. 2.

TABLE 13

| Sample No. before processing | Removal ratio of Al$_2$O$_3$ (%) | Average surface roughness (μm) | Cutting time (second) |
|---|---|---|---|
| Control article 1 | 1 | 0 | 0.063 | 40 |
| Article 26 | 1 | 50 | 0.055 | 130 |
| Article 27 | 1 | 55 | 0.046 | 190 |
| Article 28 | 1 | 60 | 0.039 | 230 |
| Article 29 | 1 | 100 | 0.031 | 300 |

What is claimed is:

1. A coated hard alloy tool having a cutting edge including a ridge and comprising a substrate made of a hard alloy, and a multi-layer ceramic coating film provided on the surface of said substrate, said coating film including at least one oxide layer and at least one non-oxide layer, the top several layers of said coating film being missing partially or completely along said ridge, at least one oxide layer being included in missing layers among said top several layers, whereby a non-oxide layer, whose main component is a nitride or a carbonitride, of said coating film is exposed along said ridge where said top several layers are missing.

2. A coated hard alloy tool as claimed in claim 1 wherein said at least one oxide layer included in said top several layers is an Al$_2$O$_3$ layer or a layer whose main component is Al$_2$O$_3$.

3. A coated hard alloy tool as claimed in claim 1 wherein all of oxide layers included along said coating film are removed in said ridge.

4. A coated hard alloy tool as claimed in claim 1 wherein said layer exposed along said ridge where said top several layers are missing is a layer of TiCN having a mol fraction of C:N of between 5:5 and 7:3.

5. A coated hard alloy tool as claimed in claim 1 wherein said layer exposed along said ridge where said top several layers are missing has a residual stress of −5 to 10 kgf/mm$^2$.

6. A coated hard alloy tool as claimed in claim 1 wherein said layer exposed along said ridge where said top several layers are missing has an average surface roughness Ra not more than 0.05 μm.

* * * * *